(12) United States Patent
Bögler et al.

(10) Patent No.: US 12,276,682 B2
(45) Date of Patent: Apr. 15, 2025

(54) METHOD FOR MONITORING THE STATUS OF AN APPARATUS AND ASSEMBLY

(71) Applicant: Siemens Aktiengesellschaft, Munich (DE)

(72) Inventors: Marco Bögler, Baiersdorf (DE); Jürgen Zettner, Veitsbronn (DE)

(73) Assignee: Siemens Aktiengesellschaft, Munich (DE)

( * ) Notice: Subject to any disclaimer, the term of this patent is extended or adjusted under 35 U.S.C. 154(b) by 335 days.

(21) Appl. No.: 17/741,674

(22) Filed: May 11, 2022

(65) Prior Publication Data

US 2022/0365121 A1 Nov. 17, 2022

(30) Foreign Application Priority Data

May 12, 2021 (EP) ..................................... 21173456

(51) Int. Cl.
*G01R 23/167* (2006.01)
(52) U.S. Cl.
CPC .................................. *G01R 23/167* (2013.01)
(58) Field of Classification Search
CPC ............................. G01R 23/167; G01M 7/025
See application file for complete search history.

(56) References Cited

U.S. PATENT DOCUMENTS

| 4,383,535 A | 5/1983 | Schorr |
| 4,870,863 A * | 10/1989 | Duncan ................. G01D 21/00 361/679.01 |
| 4,885,707 A | 12/1989 | Nichol et al. |
| 2003/0074159 A1 | 4/2003 | Bechhoefer et al. |

(Continued)

FOREIGN PATENT DOCUMENTS

| CN | 106092565 | 11/2016 |
| CN | 110488133 | 11/2019 |

(Continued)

OTHER PUBLICATIONS

Siemens, SIPLUS SIM 1281, Condition Montioring System SM 1281 Condition Monitoring, Jun. 2016, AE536912747-AB, Betriebsanleitung, Seiten 1-191; 2016.

(Continued)

*Primary Examiner* — Tung X Nguyen
(74) *Attorney, Agent, or Firm* — Cozen O'Connor

(57) ABSTRACT

A method for monitoring the status of an apparatus, wherein an analog signal is converted into a digital signal with an analog-digital converter operating within a measuring range, signal portions of the analog signal extending beyond the measuring range are cut in the digital signal, a spectral analysis is applied to the digital signal to determine which frequency potions the analog signal possesses in a frequency spectrum and conclude a malfunction of the apparatus when the analog signal exceeds the measuring range, where when the analog signal extending beyond the measuring range is in the digital signal, this event is detected and determined as a number, where a signal quality is provided which is used to assess whether known damage frequencies can still be identified from determined frequency portions of the frequency spectrum, although additional overcontrol portions in the frequency spectrum occur as a result of possibly cut signal portions.

16 Claims, 9 Drawing Sheets

(56) References Cited

U.S. PATENT DOCUMENTS

| | | | | |
|---|---|---|---|---|
| 2007/0052571 | A1* | 3/2007 | Sherry | H03M 3/486 341/155 |
| 2013/0130734 | A1* | 5/2013 | Rice | G01M 5/0066 73/497 |
| 2017/0363481 | A1 | 12/2017 | Hida et al. | |
| 2018/0328807 | A1* | 11/2018 | Brunn | G01H 1/00 |
| 2019/0353692 | A1 | 11/2019 | Batzer | |
| 2019/0377053 | A1 | 12/2019 | Peev et al. | |
| 2019/0386485 | A1 | 12/2019 | Hao | |
| 2021/0215750 | A1* | 7/2021 | Federley | G01R 31/002 |
| 2021/0293676 | A1* | 9/2021 | Tey | G01N 33/383 |

FOREIGN PATENT DOCUMENTS

| | | |
|---|---|---|
| CN | 110595524 | 12/2019 |
| CN | 110674891 | 1/2020 |
| CN | 112230047 | 1/2021 |
| EP | 0028397 | 5/1981 |
| EP | 1528377 | 5/2005 |
| JP | 2016085044 | 5/2016 |
| WO | 2016111128 A1 | 8/2017 |

OTHER PUBLICATIONS

EP Search Report dated Oct. 13, 2021 based on EP 21173456 filed May 12, 2021.

Hu Geng et al. "Microcurrent measurements in miniature electrochemical systems", Microcomputer and Electronics, vol. 26, No. 6, pp. 1-4, Jun. 5, 2009.

Yuchen Liu et al. "Design and Fabrication of Intelligent Resistance-Capacitance Measuring ", Comupter Measurement & Control, pp. 297-302, 2018-11-25.

Hang Yingzi et al. "Research on key technology of liquid leakage sensing based on lateral coupling effect of plastic optical fibre", North University of China, pp. 1-111, Feb. 15, 2019.

Wang Lifeng et al. "Research on fault detection method of 3+1S gyro", Chinese Space Science and Technology, pp. 52-58, Dec. 25, 2009.

* cited by examiner

METHOD FOR MONITORING THE STATUS OF AN APPARATUS AND ASSEMBLY

BACKGROUND OF THE INVENTION

1. Field of the Invention

The invention relates to a method for monitoring the status of an apparatus by measuring an analog signal which is continuous in terms of time and value and which represents a status variable of the apparatus, where at scanning times within a measuring interval the analog signal is converted into a digital signal using an analog-digital converter, where the analog-digital converter is operated within a measuring range, where signal portions of the analog signal that extend beyond the measuring range are cut into a digital signal in the event that the analog signal exceeds the measuring range, and where a spectral analysis is then applied to the digital signal to determine which frequency portions the analog signal comprises in a frequency spectrum, and to conclude a malfunction of the apparatus based on a comparison with the occurring frequency portions and known damage frequencies.

The invention also relates to an electronic assembly, which is configured to monitor the status of an apparatus, comprising an input circuit for measuring an analog signal that is continuous in terms of time and value and that represents a status variable of the apparatus, an analog-digital converter that scans the analog signal at scanning times within a measuring interval and converts the same into a digital signal, where the analog-digital converter is configured to operate within a measuring range, where in the event that the analog signal exceeds the measuring range, to cut signal portions, which extend beyond the measuring range, of the analog signal in the digital signal, to apply a means for spectral analysis (e.g., a spectral analyzer) to the digital signal of a spectral analysis, in order to determine which frequency portions the analog signal comprises in a frequency spectrum, and to conclude a malfunction of the apparatus on the basis of a comparison with the occurring frequency portions and known damage frequencies.

2. Description of the Related Art

An assembly and method for monitoring the status of an apparatus are known, for instance, from the operating instructions "Siemens, SIPLUS SM 1281, Condition Monitoring System SM 1281 Condition Monitoring, June 2016, AE536912747-AB".

In the context of the invention, a status monitoring of an apparatus is understood to mean a monitoring of machines or systems as a preventative measure, in order to avoid more significant damage or downtimes.

A diagnosis of bearing shields, for instance, is performed by a frequency analysis based on a vibration diagnosis. The principle of a frequency analysis consists in converting a signal from the time range via a spectral analysis into the frequency range. One customary mathematical method for this is the Fourier transformation.

With conventional methods and assemblies, it is disadvantageous that, for instance, with a vibration analysis, in particular with significantly damaged bearings, the degree of damage of which is to be diagnosed, the sensor signal inputs briefly go to saturation, because an upper/lower measuring input range is reached via vibration amplitudes that occur in real life. Other reasons for high vibration amplitudes may be changing machine strand alignments and imbalances occurring as a result of faulty components or process influences. As a result, sensor signal inputs and measuring inputs of the digitalizing system can be overcontrolled, because the design measuring ranges are exceeded by errors which occur in real life.

Sensor signal saturations also occur in a current signature analysis, above all when current converters with ferrite cores, but also Hall sensor or Rogowski current measuring inputs with high or inflated starting currents of electric machines go to saturation or when critical residual currents generate in individual branches of a three-conductor system, for the degree of which the measuring path was not designed.

With the conventional apparatuses and methods in accordance with the prior art, it is disadvantageous that a detected signal with cut signal portions, which are particularly produced by an over control of the measuring inputs, produce additional interfering frequencies in a frequency spectrum to be subsequently evaluated.

SUMMARY OF THE INVENTION

It is the object of the present invention to provide a method that identifies the partial overcontrol of status monitoring sensor signals and supplies a measure of the overcontrol or a measure of a signal quality.

These and other objects and advantages is in accordance with the invention by a method in which in the event that, at a scanning time, the analog signal extending beyond the measuring range is cut in the digital signal, this event is detected and is determined as a number, where a signal quality is provided as a quotient from the number relating to an overall scanning number within the measuring interval, and the signal quality is used to assess whether the known damage frequencies can still be identified from the determined frequency portions of the frequency spectrum, although additional overcontrol portions occur in the frequency spectrum as a result of possible cut signal portions.

The inventive method provides the ability to determine at each scanning time whether a measuring range was overcontrolled and as a result whether a cut signal has developed. A number of cut signal events is then related to the overall number of scans. It is advantageous if the signal quality is not only determined and communicated to an overlaid system or an app, but instead is also used for the optimized use of signal correction methods.

Accordingly, in an optimized embodiment of the method, provision is made to correct or estimate the digital signal with a signal correction method, as a result of which the additional overcontrol portions produced as a result of the cutting are eliminated or at least reduced in an estimate signal, where the known damage frequencies are still identified and mapped in a transfer function, and where as a function of the signal quality, the transfer function is used further up to a predeterminable limit value of the signal quality.

In accordance with the method, the number of samples are now detected continuously outside of or at the edges of a specific measuring range, which are also defined as lower level and upper level. As a result, a signal quality can be provided with this knowledge. The cited limits can be defined as those with which a certain linearity of the measuring channel is reliably ensured, i.e., those that can be used at most in the analog-digital converter or an amplifier (e.g., operating voltages distance from the operating voltages) or those that reliably permit operation at a specific adjustable application measuring limit.

The largest signal amplitude that can be applied to the inputs of the converter before it results in "clipping" at the digital output is referred to as the full measuring range (also referred to as full scale) of an A/D converter. With full scale, the output uses the minimum and the maximum codes of the A/D converter.

In the context of the invention, clipping is understood to mean that the excess signal portions are "cut" from the processing hardware or software. Most damage types in a spectrum can be identified in an occurrence of typical damage frequencies or typical patterns of damage frequencies. As a result, it is disadvantageous, if in this spectrum to be analyzed, frequency portions still additionally appear that have been produced by clipping.

However, the inventive method now makes it possible to better estimate an observation and evaluation of the frequency portions via the determined signal quality. If the vibrations are larger than the measuring range as a result of amplitudes that occur in real life, for instance, then the information of the signal quality can be used to perform the evaluation of the frequency portions and/or the evaluation of a deteriorating state of the apparatus to be monitored.

It is also advantageous if the transfer function is modified as a function of the signal quality.

Furthermore, it is advantageous if a series of transfer functions are formed and archived in a learning phase in a quality state of the apparatus as a function of the signal quality, where the transfer function in the original quality state of a monitored apparatus is then used as a reference.

In particular, with respect to a suitable estimate signal in order to reduce the frequency portions produced as a result of the clipping by means of the overcontrol portions, it is advantageous to use a Wiener filter as a signal correction method. Wiener filters are used in methods that attempt to reconstruct (estimate) the sampling values that are missing or falsified or distorted as a result of noise. Although the Wiener filter is used to estimate an unknown original signal in the time range from a noisy signal, which is measured and distorted by an LDI system with a transfer function, in the time range as the best possible approximation Y, the filter can also be applied to clipped signals.

It is also an object of the invention to provide electronic assembly, in which a detection device is present in the assembly, which is configured, in the event that the analog signal extending beyond the measuring range at a scanning time is cut in the digital signal, to detect this event and to increment the same in a counter as a number, where a signal quality evaluation device is present, which provides a signal quality as a quotient from the number relating to an overall scanning number within the measuring interval. The electronic assembly furthermore includes a decision device, which is configured to assess, based on the signal quality, whether the known damage frequencies can still be identified from the determined frequency portions of the frequency spectrum, although additional overcontrol portions may result in the frequency spectrum as a result of possible cut signal portions.

Above all with high frequencies, clipping produces spectral lines with amplitudes of up to 10%. This behavior, transferred to bearing damage analysis, means that spectral lines which stand for a bearing damage could be faded in. It either results in a misinterpretation ("false positive"), or a bearing damage is graded as fatal or as actual, because the existing lines and harmonics are overlaid by the lines of the clipping.

In one embodiment of the assembly, a filter device is provided, in which a signal correction method executes, which corrects or estimates the digital signal and which are eliminated or at least reduced by cutting developed additional overcontrol portions in an estimate signal, where the filter device further includes a transfer function, which still maps the known damage frequencies, where the filter device has an input for the signal quality and the filter device is configured to further use the transfer function up to a predeterminable limit value as a function of the signal quality.

If the signal correction method is applied, expectable false positive errors reduce, a measuring system could also operate more reliably in specific frequency bands, such as beyond the design measuring range. Measurable damage frequencies, which, in normal operation, i.e., all damage frequencies within the measuring limits (signal quality Q=1) are identified by the Wiener filter and mapped in the transfer function. If clipped signals (Q<1) now occur, then the transfer function should still be retained, i.e., artifacts as a result of clipping can firstly be further suppressed, possibly already existing bearing damage frequencies are, however, further transferred. The method for status monitoring is largely retained in terms of its spectral representation and also classification functionalities.

To achieve that, it is advantageous with an adjustment device within the assembly, which is configured to modify the transfer function as a function of the signal quality.

The assembly can be optimized even further with a learning device, which is configured to form and archive a series of transfer functions in a learning phase in a quality state of the apparatus as a function of the signal quality, is further configured to take the transfer function in the original quality state of a monitored apparatus as reference.

A Wiener filter is advantageously implemented in the filter device.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The drawing shows an exemplary embodiment of the invention, in which.

DETAILED DESCRIPTION OF THE EXEMPLARY EMBODIMENTS

Figure 1:
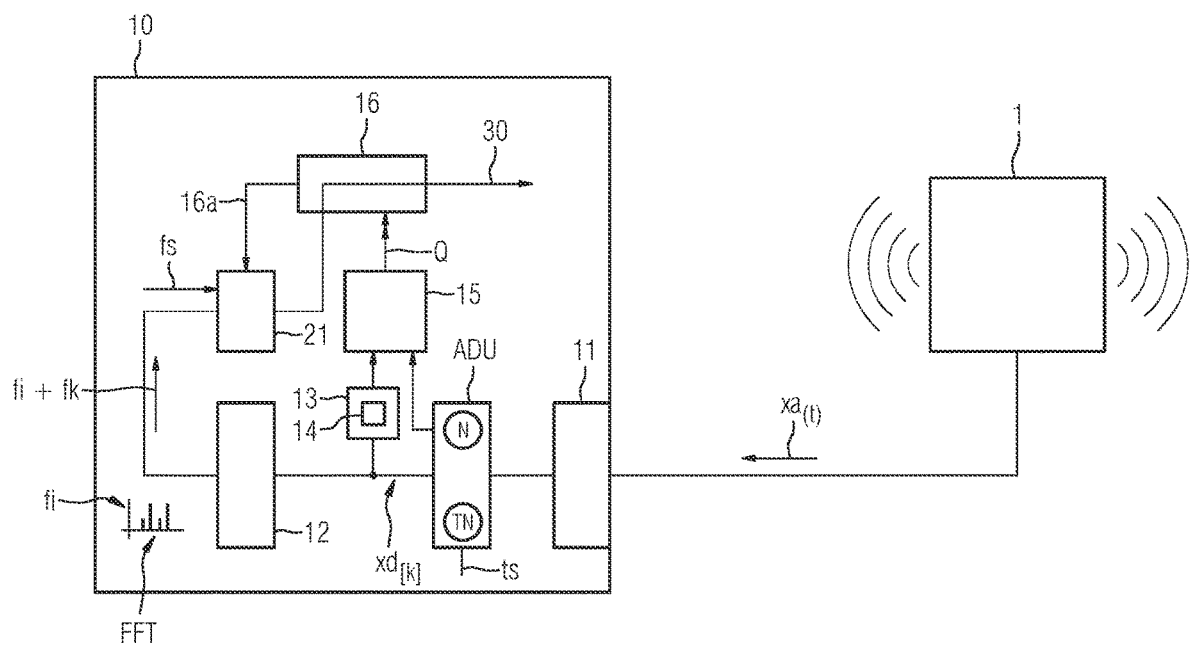
FIG. 1 shows an assembly for status monitoring in accordance with the invention.

FIG. 1 shows an assembly 10 configured to monitor the status of an apparatus 1. The assembly 10 comprises an input circuit 11 for measuring an analog signal xa(t) which is continuous in terms of time and value, and represents a status variable of the apparatus 1, an analog-digital converter ADU, which scans the analog signal xa(t) at scanning times ts within a measuring interval Tn and converts the same into a digital signal xd[k], where the analog-digital converter ADU is configured to operate within a measuring range MB, where in the event that the analog signal xa(t) exceeds the measuring range MB, to cut signal portions of the analog signal xa(t), which extend beyond the measuring range MB, in the digital signal xd[k] (see FIG. 5). Furthermore, the assembly 10 has a means 12 for spectral analysis (e.g., a spectral analyzer) in order to apply a spectral analysis to the digital signal xd[k]. It is possible to read out from the determined spectral analysis or from the determined frequency spectrum FFT, which frequency portions fi the analog signal xa(t) contains and it is possible to conclude a malfunction of the apparatus 1 has occurred based on a comparison with the occurring frequency portions fi and known damage frequencies fs in a comparison device 21.

In accordance with the invention, a detection device 13 is now available in the assembly 10, which is configured, in the event the analog signal xa(t) that extends beyond the measuring range MB at a scanning time ts is cut in the digital signal xd[k], to detect this event and to increment the same in a counter 14 as a number Nsat.

A signal quality Q as a quotient from the number Nsat relating to an overall scanning number N within the measuring interval Tn can now be provided via a signal quality evaluation device 15. Furthermore, a decision device 16 is available in the assembly 10, which is configured to assess, based on the signal quality Q, whether the known damage frequencies fs can still be identified from the determined frequency portions fi of the frequency spectrum FFT, although additional overcontrol portions fk result in the frequency spectrum FFT as a result of possibly cut signal portions.

If the decision is made in the decision device 16 with the aid of the signal quality Q that the damage frequencies fs can still be determined from the determined frequency portions fi, then a valid signal 30 is therefore forwarded to an evaluation unit.

Figure 2:
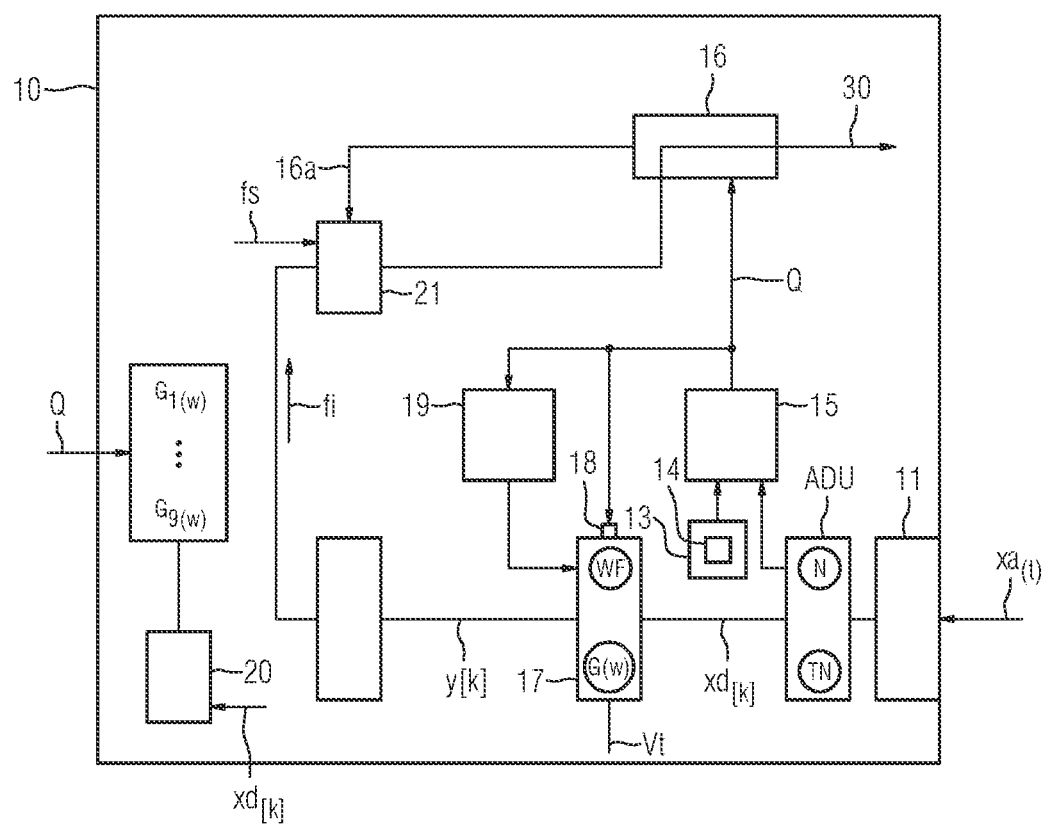
FIG. 2 shows alternative embodiment of the assembly of FIG. 1.

FIG. 2 shows the assembly 10 shown in FIG. 1 in one embodiment. The assembly 10 now additionally has a filter device 17, in which a signal correction method WF executes, which corrects or estimates the digital signal xd[k] and the additional overcontrol portions fk produced by the cutting are as a result eliminated or at least reduced in an estimate signal y[k]. The filter device 17 further has a transfer function G(w), which still maps the known damage frequencies fs, where the filter device 17 has an input 18 for the signal quality Q and the filter device 17 is configured to further use the transfer function G(w) up to a predeterminable limit value Vt as a function of the signal quality Q.

With additional reference to FIG. 2, the assembly 10 further has an adjustment device 19, which is configured to modify the transfer function G(w) as a function of the signal quality Q. In the embodiment in accordance with FIG. 2, the assembly 10 is also provided with a learning device 20, which is configured to form and archive a series of transfer functions Gj(w) in a learning phase in a quality state of the apparatus 1 as a function of the signal quality Q. Furthermore, the learning device 20 is configured to take as reference the transfer function P(w) in the original quality state of a monitored apparatus 1.

A Wiener filter is implemented in the filter device 17.

Figure 3:
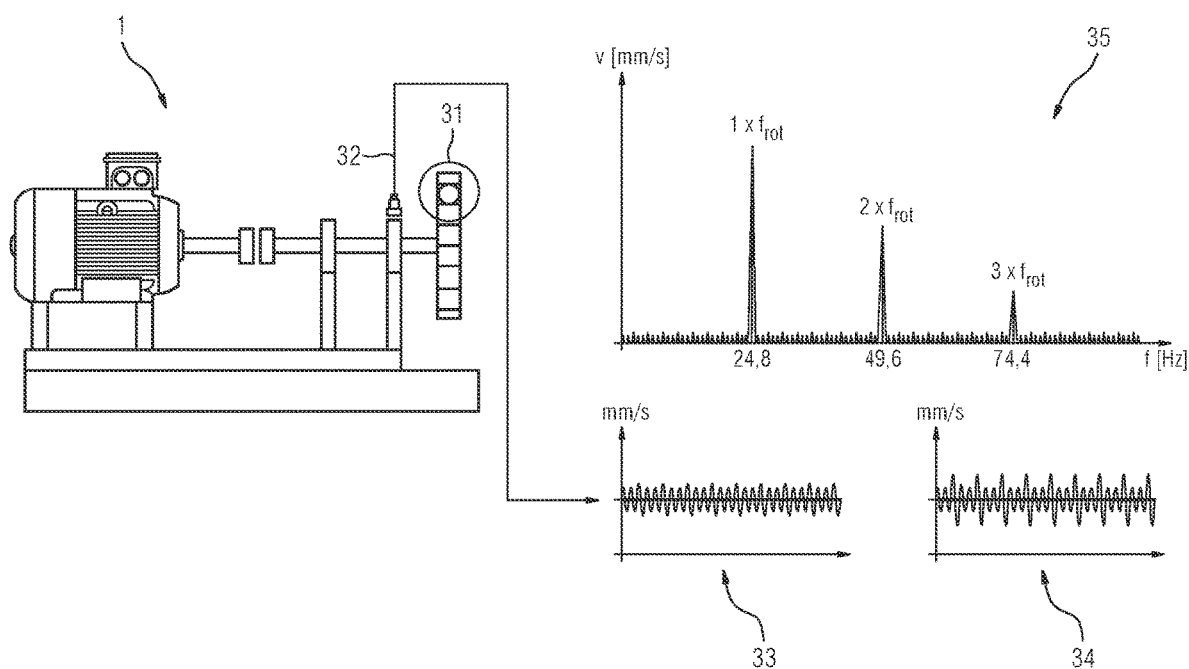
FIG. 3 shows graphical plots of the principle of a status monitoring of an apparatus in accordance with the invention.

FIG. 3 shows a schematic representation of a status monitoring of an apparatus 1. The apparatus 1 comprises a motor with a transmission and a drive shaft and an electrical mass. An imbalance 31 sits on the electrical mass, for instance. A measurement 33 is recorded in the quality state via a sensor 32. On account of the imbalance 31 on the electrical mass, a measurement 34 with an increased amplitude of the machine vibration can be determined as a malfunction. The associated spectrum 35 of the vibration speeds shows three different frequency portions for three different rotation frequencies.

Figure 4:
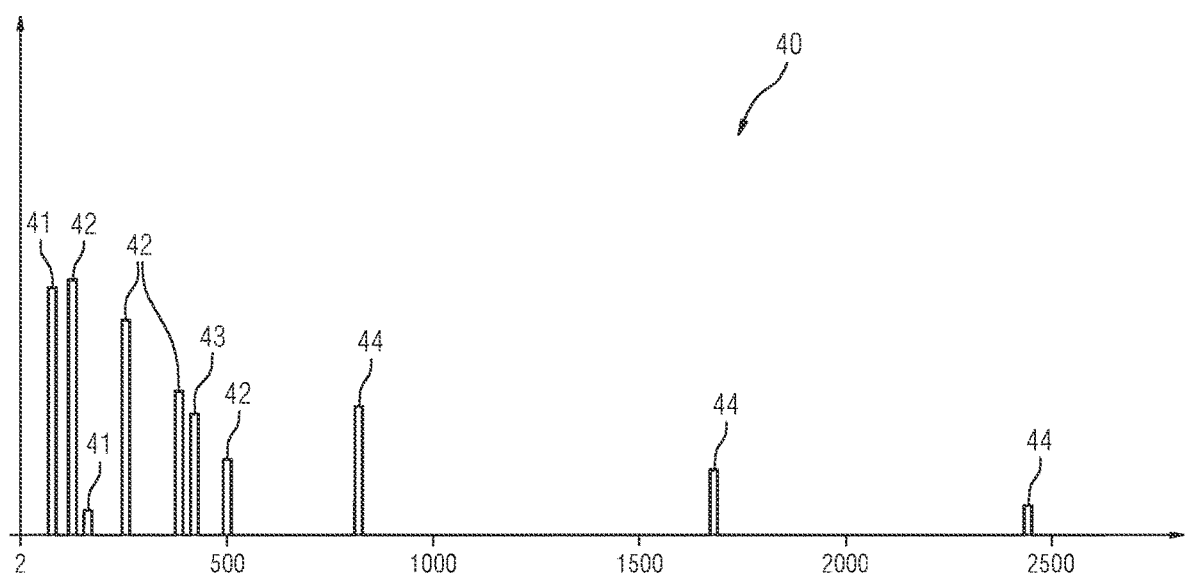
FIG. 4 shows an exemplary graphical plot of a spectrum with interference frequencies in accordance with the invention.

FIG. 4 shows by way of example, for instance, which errors can be determined with the aid of damage frequencies on a frequency spectrum. Therefore, the spectrum 40 with interference frequencies shows at points 41 a belt error, at points 42 a rolling bearing damage, at points 43 a blade pass frequency and at points 44 a meshing defect.

Figure 5:
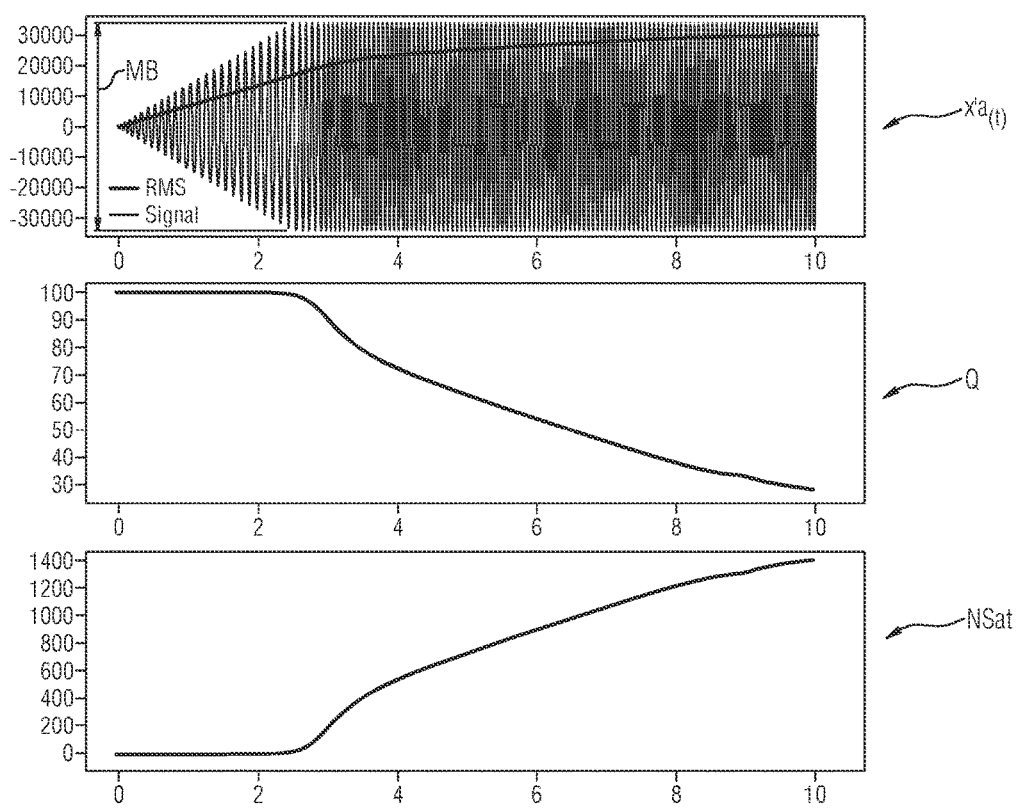
FIG. 5 shows a graphical plot of a signal to be detected, which passes into a measuring range limit, in accordance with the invention.

FIG. 5 shows from top down a raw signal x'a(t) that reaches the limit, where the measuring range MB is shown in the signal course x'a(t) and as soon as the signal portions of the raw signal x'a(t) leave the measuring range, these are cut. The signal quality Q is applied therebeneath, which reduces from 100% to 0% with an increasing clipping. A number Nsat of clipped signal portions mapped therebelow behaves in a conversely proportional manner.

Figure 6:
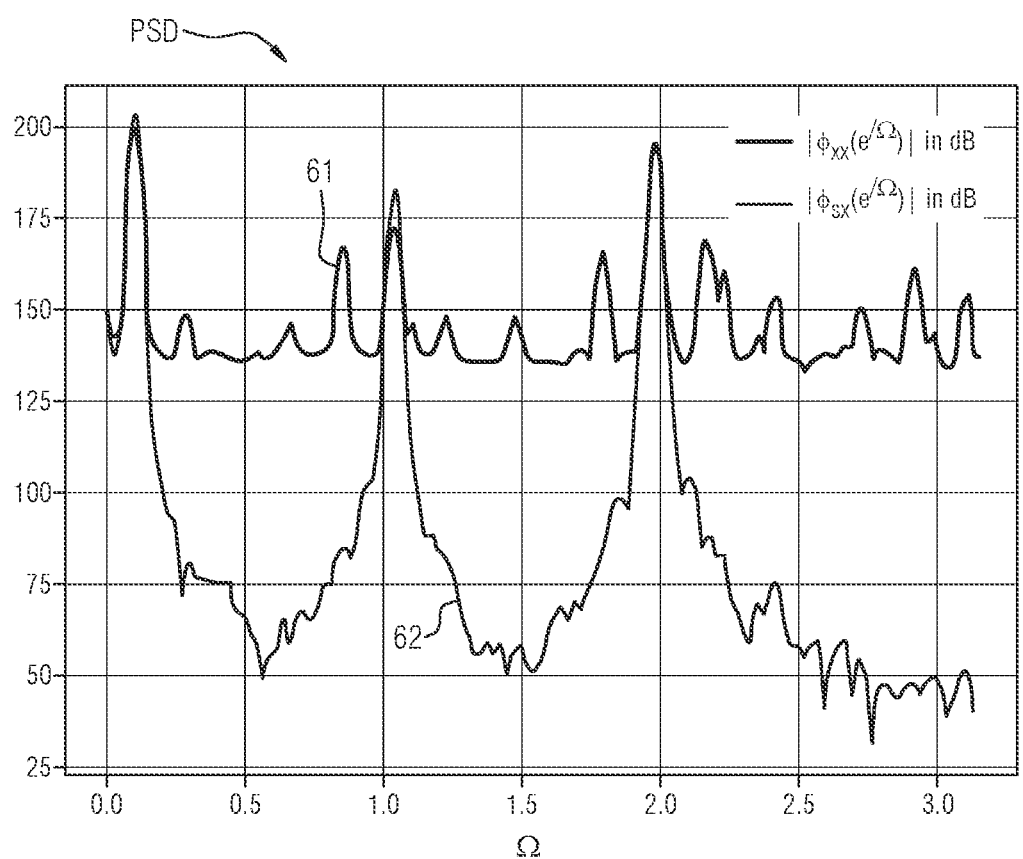
FIG. 6 shows a graphical plot of diagram for a spectral power density.

FIG. 6 shows a spectral power density PSD, where the diagram shows the power density 61 for x with x, on the one hand, and the power density 62 for x with the clipped signal, on the other.

Figure 7:
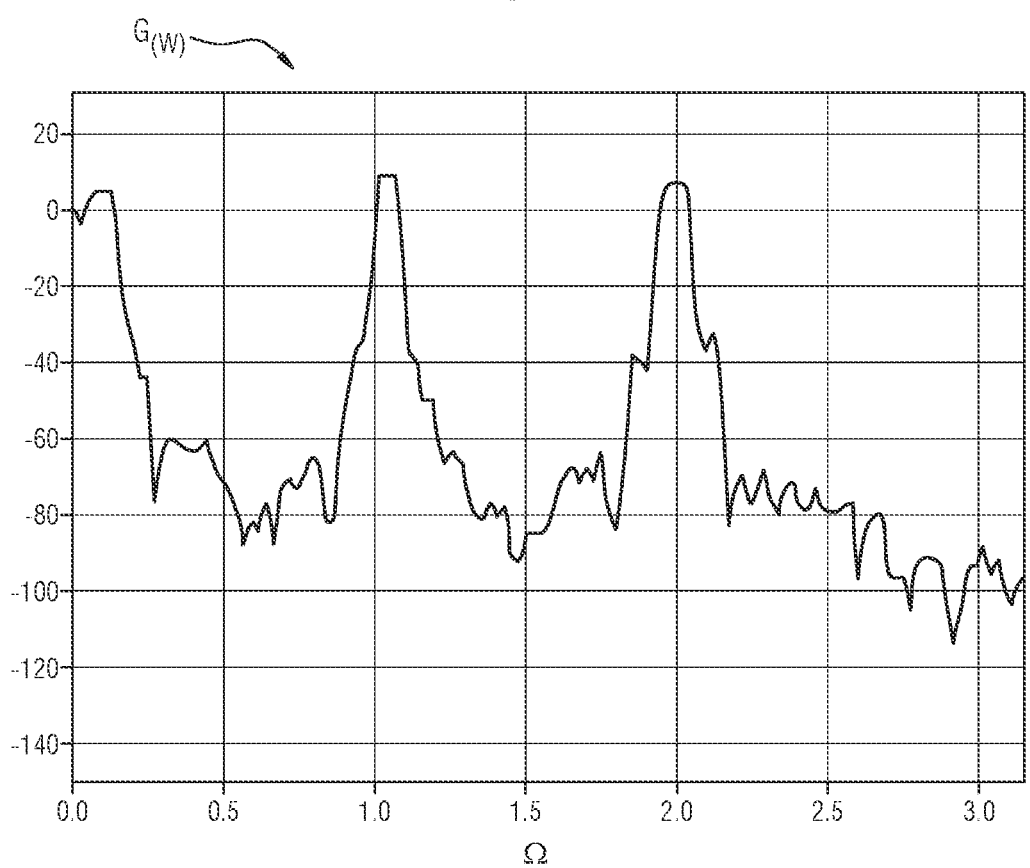
FIG. 7 shows a graphical plot of a transfer function derived from the spectral power density.

FIG. 7 shows the filters constructed from the courses in FIG. 6 in its transfer function according to Wiener. Clipping produces above all at high frequencies spectral lines with amplitudes up to 10%. This behavior, transferred to bearing damage analyses, means that spectral lines, which are available for a bearing damage, could be faded in. It either results in a misinterpretation (false positive) or a bearing damage is graded as fatal or as it actually is. This is because the existing spectral lines and harmonics are overlaid by the interference portions produced by clipping.

The estimated signal formed from the original signal using the Wiener filter now has almost exclusively the three main components of the original signal. The false portions of the estimated signal are in the range <1%, i.e., spectral lines produced by clipping are suppressed by $10^{-2}$ and existing spectral lines are broadened. The Wiener filter can be optimized for so long by continuous calculation of the spectral power densities PSD of PSDxx and PSDXS using a transfer function resulting therefrom, provided the inventive measure Q, or a similar number of saturated measured values exceeds a threshold.

Figure 8:
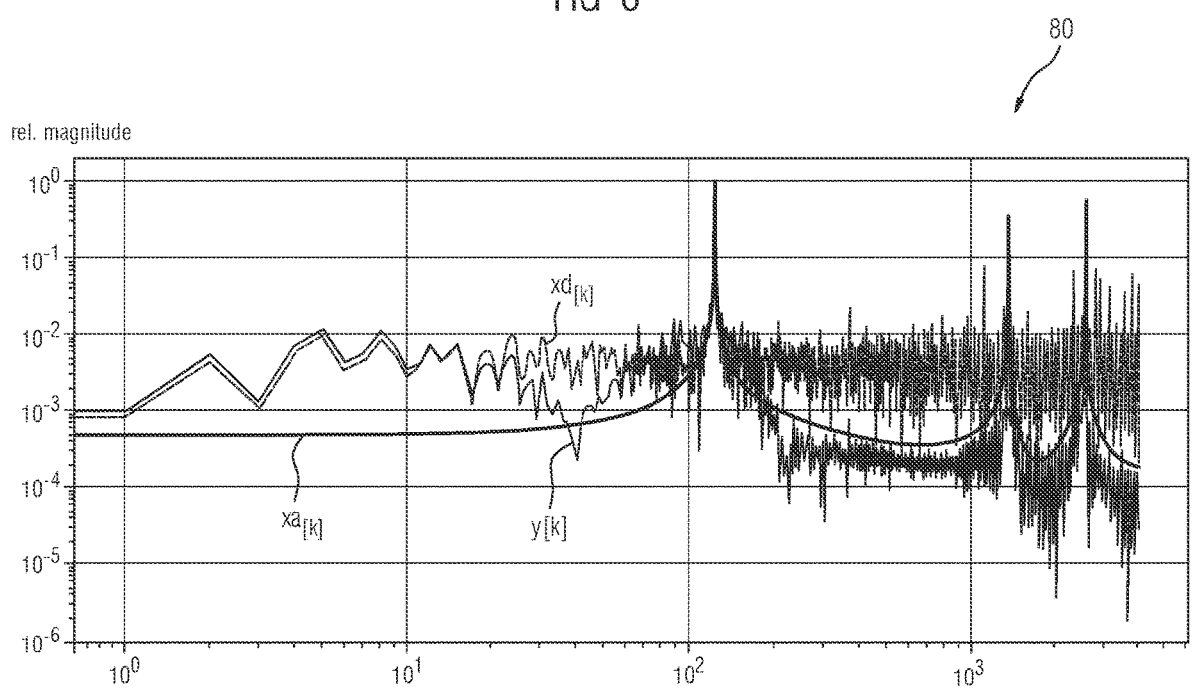
FIG. 8 shows a graphical plot of signal estimated with a Wiener filter in contrast to a source signal.

FIG. 8 shows in an FFT spectrum 80 an original signal Xa[k], an observed signal Xd[k], which contains clipping portions and the signal y[k] estimated by the Wiener filter.

The signal Y estimated from X with the Wiener filter has almost exclusively the three main components of the original signal. The false portions of the estimated signal are in the range <1%, i.e., spectral lines produced by clipping are suppressed by $10^{-2}$ and existing spectral lines are shown broadened.

Figure 9:
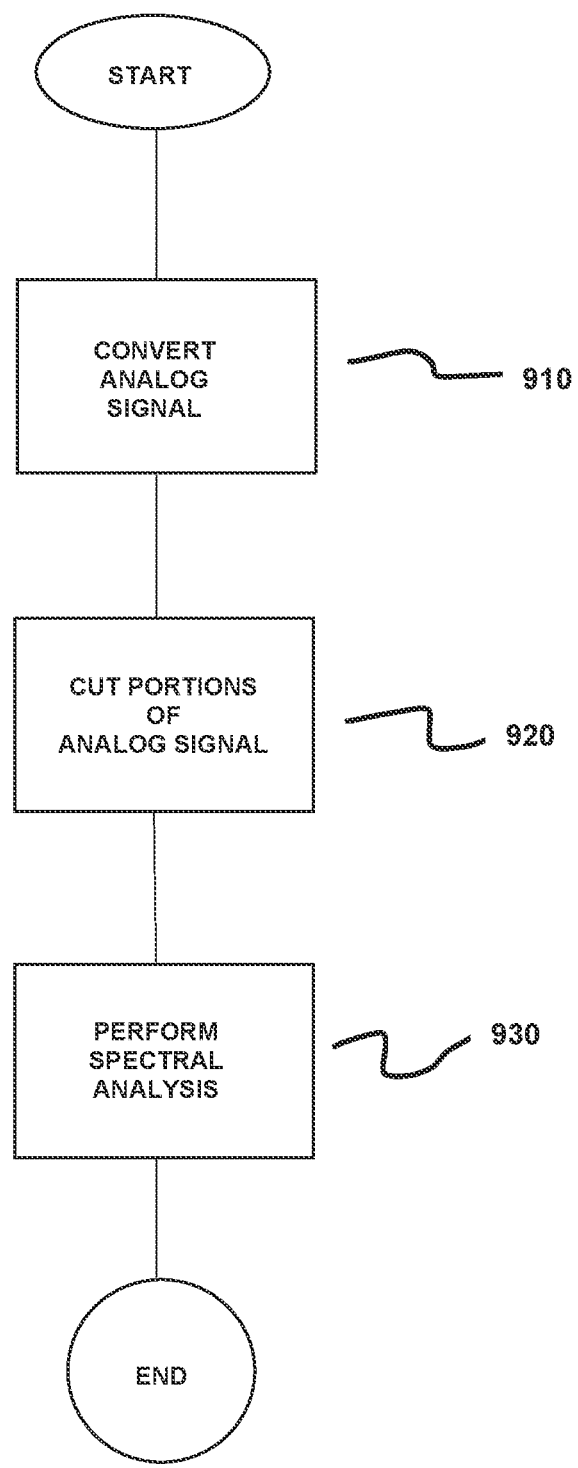
FIG. 9 is a flowchart of the method in accordance with the invention.

FIG. 9 is a flowchart the method for monitoring the status of an apparatus 1 by measuring an analog signal xa(t) that is continuous in terms of time and value and that represents a status variable of the apparatus 1.

The method comprises converting the analog signal xa(t), at scanning times is within a measuring interval TN, into a digital signal xd[k] via an analog-digital converter ADU which is operated within a measuring range MB, as indicated in step 910.

Next, signal portions of the analog signal xa(t) that which extend beyond the measuring range MB are cut in the digital signal xd[k] in an event the analog signal xa(t) exceeds the measuring range (MB), as indicated in step 920.

Next, a spectral analysis is applied to the digital signal xd[k] to determine which frequency portions fi the analog signal xa(t) comprises in a frequency spectrum FFT, and to conclude a malfunction of the apparatus 1 based on a comparison with the occurring frequency portions fi and known damage frequencies fs, as indicated in step 930.

In accordance with the invention, in an event that, at a scanning time ts, the analog signal xa(t) that extends beyond the measuring range MB is cut in the digital signal xd[k], this event is detected and is determined as a number NSat. In addition, a signal quality Q is provided as a quotient from the number NSat relating to an overall scanning number N within the measuring interval TN, and the signal quality Q is utilized to assess whether the known damage frequencies fS can still be identified from the determined frequency portions fi of the frequency spectrum FFT, although additional overcontrol portions fk occur in the frequency spectrum as a result of possibly cut signal portions.

Thus, while there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for monitoring status of an apparatus by measuring an analog signal which is continuous in terms of time and value and which represents a status variable of the apparatus, the method comprising:
    converting the analog signal, at scanning times within a measuring interval, into a digital signal via an analog-digital converter which is operated within a measuring range;
    cutting signal portions of the analog signal which extend beyond the measuring range in the digital signal for portions of the analog signal which exceed the measuring range; and
    applying a spectral analysis to the digital signal to determine which frequency portions of the analog signal are included in a frequency spectrum, and to conclude a malfunction of the apparatus exists based on a comparison of the frequency portions of the analog signal included in the frequency spectrum and known frequencies which indicate a presence of damage;
    wherein in an event that, at a scanning time, the analog signal which extends beyond the measuring range is cut in the digital signal, this event is detected and is determined as a number; and
    wherein a signal quality is provided as a quotient from a number relating to an overall scanning number within the measuring interval, and the signal quality is utilized to assess whether the known frequencies which indicate the presence of damage are still identifiable from the determined frequency portions of the frequency spectrum, additional overcontrol portions occurring in the frequency spectrum as a result of cut signal portions.

2. The method as claimed in claim 1, wherein the digital signal is corrected or estimated with a signal correction method and additional overcontrol portions produced by said cutting are as a result eliminated or at least reduced in an estimate signal; wherein the known frequencies which indicate the presence of damage are still identified and mapped in a transfer function; and wherein the transfer function is further utilized as a function of the signal quality up to a predeterminable limit value of the signal quality.

3. The method as claimed in claim 2, wherein the transfer function is modified as a function of the signal quality.

4. The method as claimed in claim 2, wherein a series of transfer functions are formed and archived in a learning phase in a quality state of the apparatus as a function of the signal quality; and wherein the transfer function is subsequently utilized as a reference in the original quality state of a monitored apparatus.

5. The method as claimed in claim 3, wherein a series of transfer functions are formed and archived in a learning phase in a quality state of the apparatus as a function of the signal quality; and wherein the transfer function is subsequently utilized as a reference in the original quality state of a monitored apparatus.

6. The method as claimed in claim 2, wherein a Wiener filter is utilized as a signal correction method.

7. The method as claimed in claim 3, wherein a Wiener filter is utilized as a signal correction method.

8. The method as claimed in claim 4, wherein a Wiener filter is utilized as a signal correction method.

9. An electronic assembly which monitors a status of an apparatus, the assembly comprising:
    an input circuit for measuring an analog signal which is continuous in terms of time and value and which represents a status variable of the apparatus;
    an analog-digital converter which scans the analog signal at scanning times within a measuring interval and which converts the scanned analog signal into a digital signal, the analog-digital converter being configured to, within a measuring range, for portions of the analog signal which exceed the measuring range, cut signal portions of the analog signal which extend beyond the measuring range in the digital signal;
    a spectral analyzer for applying a spectral analysis to the digital signal to determine which frequency portions of the analog signal are included in a frequency spectrum and based on a comparison of the frequency portions of the analog signal included in the frequency spectrum and known frequencies which indicate the presence of damage to conclude a malfunction of the apparatus exists;

a detector which, in an event the analog signal which exceeds the measuring range at a scanning point is cut in the digital signal, detects this event and increments the event in a counter as a number;

a signal quality evaluator which provides a signal quality as a quotient from the number relating to an overall scanning number within the measuring interval; and an assessor which assesses, based on the signal quality, whether the known frequencies which indicate the presence of damage are still identifiable from the determined frequency portions of the frequency spectrum, additional overcontrol portions occurring in the frequency spectrum as a result of cut signal portions.

10. The assembly as claimed in claim 9, further comprising:

a filter in which a signal correction method executes, which corrects or estimates the digital signal and which are eliminated or at least reduced by the cutting of developed additional overcontrol portions as a result in an estimate signal;

wherein the filter further includes a transfer function which still maps the known frequencies which indicate the presence of damage, the filter having an input for the signal quality and the filter being configured to further utilize the transfer function up to a predeterminable limit value as a function of the signal quality.

11. The assembly as claimed in claim 10, further comprising:

an adjuster which is configured to modify the transfer function as a function of the signal quality.

12. The assembly as claimed in claim 10, further comprising:

a learner which, as a function of the signal quality, forms and archives a series of transfer functions in a learning phase in a quality state of the apparatus, and which acquires the transfer function in the original quality state of a monitored apparatus as a reference.

13. The assembly as claimed in claim 11, further comprising:

a learner which, as a function of the signal quality, is configured to form and archive a series of transfer functions in a learning phase in a quality state of the apparatus, and which is further configured to acquire the transfer function in the original quality state of a monitored apparatus as a reference.

14. The assembly as claimed in claim 10, wherein the filter comprises a Wiener filter.

15. The assembly as claimed in claim 11, wherein the filter comprises a Wiener filter.

16. The assembly as claimed in claim 12, wherein the filter comprises a Wiener filter.

* * * * *